US012772656B2

(12) United States Patent
He et al.

(10) Patent No.: US 12,772,656 B2
(45) Date of Patent: Oct. 20, 2026

(54) DISPLAY ELEMENT AND DISPLAY DEVICE COMPRISING LIGHT DIFFUSING LAYER AND P-TYPE AND N-TYPE CHARGE GENERATION LAYERS

(71) Applicants: Chongqing BOE Display Technology Co., Ltd., Chongqing (CN); BOE TECHNOLOGY GROUP CO., LTD., Beijing (CN)

(72) Inventors: Liu He, Beijing (CN); Jaeho Lee, Beijing (CN); Dongyu Gao, Beijing (CN); Xunfei Tong, Beijing (CN); Han Nie, Beijing (CN); Gen Zhao, Beijing (CN); Tong Lv, Beijing (CN); Jingwei Huang, Beijing (CN); Yingxiong Deng, Beijing (CN); Chengji Deng, Beijing (CN); Jia Chen, Beijing (CN); Xingzong Jiang, Beijing (CN); Ling Du, Beijing (CN); Chunmei Yang, Beijing (CN)

(73) Assignees: Chongqing BOE Display Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 365 days.

(21) Appl. No.: 18/578,377

(22) PCT Filed: Mar. 29, 2023

(86) PCT No.: PCT/CN2023/084731

§ 371 (c)(1),
(2) Date: Jan. 11, 2024

(87) PCT Pub. No.: WO2024/197648

PCT Pub. Date: Oct. 3, 2024

(65) Prior Publication Data

US 2025/0234698 A1 Jul. 17, 2025

(51) Int. Cl.
*H10K 50/13* (2023.01)
*H10K 50/155* (2023.01)
(Continued)

(52) U.S. Cl.
CPC ......... *H10K 50/131* (2023.02); *H10K 50/155* (2023.02); *H10K 50/166* (2023.02);
(Continued)

(58) Field of Classification Search
CPC ...... H10K 50/131; H10K 50/19; H10K 59/35; H10K 50/13; H10K 2102/351;
(Continued)

(56) References Cited

U.S. PATENT DOCUMENTS

2018/0076407 A1* 3/2018 Jung ...................... H10K 50/11
2019/0006613 A1* 1/2019 Bang .................... H10D 86/423
(Continued)

*Primary Examiner* — Didarul A Mazumder
(74) *Attorney, Agent, or Firm* — WHDA, LLP

(57) ABSTRACT

A display element includes: multiple light-emitting elements, at least one light-emitting element includes an anode layer and a cathode layer arranged opposite to each other, and at least two light-emitting units located between the anode layer and the cathode layer. When an application environment of the display element changes from a normal temperature to a first temperature, a change amount of a horizontal coordinate of a white point of the display element is less than or equal to 0.002, a change amount of a vertical coordinate of the white point of the display element is less than or equal to 0.008, and a color shift value of the display element is less than or equal to 1.4.

20 Claims, 8 Drawing Sheets

(51) Int. Cl.
*H10K 50/16* (2023.01)
*H10K 50/19* (2023.01)
*H10K 59/35* (2023.01)
*H10K 102/00* (2023.01)

(52) U.S. Cl.
CPC ............. *H10K 50/19* (2023.02); *H10K 59/35* (2023.02); *H10K 2102/351* (2023.02)

(58) Field of Classification Search
CPC .... H10K 50/155; H10K 50/166; H10K 85/30; H10K 50/12; H10K 50/171; H10K 59/353; H10K 85/6572
USPC ......................................... 257/40; 438/82, 99
See application file for complete search history.

(56) References Cited

U.S. PATENT DOCUMENTS

2019/0148648 A1* 5/2019 Lee ........................ H10K 85/30
257/40
2022/0149312 A1* 5/2022 Lee ........................ H10K 59/35

* cited by examiner

DISPLAY ELEMENT AND DISPLAY DEVICE COMPRISING LIGHT DIFFUSING LAYER AND P-TYPE AND N-TYPE CHARGE GENERATION LAYERS

CROSS-REFERENCE TO RELATED APPLICATION

The present application is the U.S. national phase of PCT Application No. PCT/CN2023/084731 filed on Mar. 29, 2023, which is incorporated by reference herein in its entirety.

TECHNICAL FIELD

The present disclosure relates to the field of display technology, in particular to a display element and a display device.

BACKGROUND

Along with the continuous development of display technology, Organic Light Emitting Diode (OLED) display elements are widely used in various fields due to such advantages as low power consumption, fast response speed, wide viewing angle and high resolution. In order to achieve high brightness in the OLED display element, excessive driving current causes an abrupt increase in heat, which degrades performance and operation life of the element.

SUMMARY

An object of the present disclosure is to provide a display element and a display device.

In order to achieve the above object, the present disclosure provides the following technical solutions.

In a first aspect, the present disclosure provides a display element including: a plurality of light-emitting elements, at least one light-emitting element includes an anode layer and a cathode layer arranged opposite to each other, and at least two light-emitting units located between the anode layer and the cathode layer. An N-type charge generation layer and a P-type charge generation layer arranged in a laminated manner are provided between at least two adjacent light-emitting units, the N-type charge generation layer is close to the anode layer and the P-type charge generation layer is close to the cathode layer. The light-emitting element further includes: a light diffusing layer located on a side of the cathode layer away from the light-emitting units, a thickness d1 of the light diffusing layer meeting: 750 Å≤d1≤800 Å. When an application environment of the display element changes from a normal temperature to a first temperature, a change amount of a horizontal coordinate of a white point of the display element is less than or equal to 0.002, a change amount of a vertical coordinate of the white point of the display element is less than or equal to 0.008, and a color shift value of the display element is less than or equal to 1.4.

Optionally, the plurality of light-emitting elements is divided into a plurality of light-emitting element groups, each light-emitting element group includes a first light-emitting element, a second light-emitting element and a third light-emitting element which are different in color, the first light-emitting element and the second light-emitting element being located in one column along a first direction, and the third light-emitting element being located in another column. In a same light-emitting element group, a distance L1 between a pixel opening region of the first light-emitting element and a pixel opening region of the third light-emitting element meets: 18 μm≤L1≤22 μm.

Optionally, the light-emitting element further includes a pixel driving circuit coupled to the anode layer, a voltage value of a positive power source signal received by the pixel driving circuit is between 4.5V and 4.7V, a voltage value of an initialization signal received by the pixel driving circuit is between −7.6V and −4.8V, and a voltage value of a negative power source signal received by the cathode layer is between −10V and −6V.

Optionally, the display element further includes a gate driving circuit coupled to the pixel driving circuit and configured to apply a scanning signal to the pixel driving circuit, a voltage value of a direct current (DC) high-level signal received by the gate driving circuit being between 5V and 9V, and a voltage value of a DC low level signal received by the gate driving circuit being between −13V and −9V.

Optionally, when the first temperature is between 25° C.-85° C., in an environment of the first temperature, the horizontal coordinate of the white point of the display element is between 0.298-0.3 and the vertical coordinate of the white point of the display element is between 0.308-0.315.

Optionally, when the first temperature is between −40° C. and 25° C., in an environment of the first temperature, the horizontal coordinate of the white point of the display element is between 0.296 and 0.3, and the vertical coordinate of the white point of the display element is between 0.327 and 0.339.

Optionally, a doping concentration m1 of the P-type charge generation layer meets: 10%≤m1≤15%.

Optionally, a doping concentration m2 of the N-type charge generation layer meets: 0.5%≤m2≤1%.

Optionally, the light-emitting element further includes a first hole transport layer located between the anode layer and the light-emitting unit adjacent to the anode layer, a doping concentration m3 of the first hole transport layer meeting: 1.0%≤m3≤1.2%.

Optionally, each of the P-type charge generation layer and the first hole transport layer is made of at least one of propylene glycol alginate sodium sulfate, nickel oxide, and poly [3-(4-methylamincarboxylbutyl) thiophene].

Optionally, the first hole transport layer includes a second base transport layer and a second doped layer, a thickness d5 of the second base transport layer meeting: 150 Å≤d5≤300 Å, a thickness d6 of the second doped layer meeting: 95 Å ≤d6≤105 Å.

Optionally, the N-type charge generation layer is made of at least one of carbon 60 or 2,9-dimethyl-4,7-biphenyl-1, 10-phenanthroline.

Optionally, the light diffusing layer is made of at least one of triarylamines, cyclic ureas, acyl structures, or dibenzothiophenes.

Optionally, the P-type charge generation layer includes a first base transport layer and a first doped layer, a thickness d2 of the first base transport layer meets: 300 Å≤d2≤500 Å, and a thickness d3 of the first doped layer meets: 50 Å≤d3≤200 Å.

Optionally, a thickness d4 of the N-type charge generation layer meets: 50 Å≤d4≤250 Å.

Optionally, the light-emitting element further includes:

a first electron transport layer located between the cathode layer and the at least two light-emitting units; and/or, a second electron transport layer located between the N-type charge generation layer and the light-emitting unit, the second electron transport layer located at a side of the N-type charge generation layer away from the P-type charge generation layer; and/or, an electron injection layer located between the cathode layer and the first electron transport layer; and/or, a hole injection layer located between the first hole transport layer and the anode layer; and/or, a second hole transport layer located between the P-type charge generation layer and the light-emitting unit, the second hole transport layer located on a side of the P-type charge generation layer away from the N-type charge generation layer.

Optionally, the light-emitting element further includes:

a first hole blocking layer located between the electron transport layer and the at least two light-emitting units; and/or, at least one second hole blocking layer, where the second hole blocking layer is located on a side of the corresponding N-type charge generation layer facing the anode layer, and the second hole blocking layer is located between the corresponding N-type charge generation layer and the light-emitting unit adjacent to the N-type charge generation layer.

Optionally, the light-emitting unit includes a buffer layer and a light-emitting material layer arranged in a laminated manner, the buffer layer being located between the light-emitting material layer and the anode layer.

Optionally, the first light-emitting element includes a red light-emitting unit, the second light-emitting element includes a green light-emitting unit, and the third light-emitting element includes a blue light-emitting unit.

The red light-emitting unit includes a red buffer layer and a red light-emitting material layer, a thickness d7 of the red buffer layer meets: 100 Å≤d7≤350 Å, a thickness d8 of the red light-emitting material layer meets: 400 Å≤d8≤500 Å, and a doping concentration m4 of the red light-emitting material layer meets: 10%≤m4≤15%;

The green light-emitting unit includes a green buffer layer and a green light-emitting material layer, a thickness d9 of the green buffer layer meets: 80 Å≤d9≤100 Å, a thickness d10 of the green light-emitting material layer meets: 300 Å≤d10≤500 Å, and a doping concentration m5 of the green light-emitting material layer meets: 8%≤m5≤10%;

The blue light-emitting unit includes a blue buffer layer and a blue light-emitting material layer, a thickness d11 of the blue buffer layer meets: 80 Å≤d11≤100 Å, a thickness d12 of the blue light-emitting material layer meets: 150 Å≤d12≤200 Å, and a doping concentration m6 of the blue light-emitting material layer meets: 2%≤m6≤3%.

Based on the technical solution of the above display element, in a second aspect, the present disclosure provides a display device including the above-mentioned display element.

BRIEF DESCRIPTION OF THE DRAWINGS

The following drawings are provided to facilitate the understanding of the present disclosure, and constitute a portion of the present disclosure. These drawings and the following embodiments are for illustrative purposes only, but shall not be construed as limiting the present disclosure. In these drawings.

DETAILED DESCRIPTION

In order to further explain the display element and the display device in the embodiments of the present disclosure, a detailed description will be given with reference to the accompanying drawings.

In the related art, in order to obtain an OLED display element having high brightness, heat is abruptly increased due to an excessive driving current, thereby degrading performance and operation life of the element. Therefore, in order to achieve high light emission brightness and efficiency at a lower current density while improving the operation life of the element, at least two OLED units are connected in series in the present disclosure, so as to provide a tandem OLED element capable of achieving higher light emission brightness and current efficiency.

The tandem OLED display element achieves brightness, efficiency and service life at the same time at the expense of some other characteristic properties. For example, as an ambient temperature in use changes (due to geographical location difference, a temperature in the northern region is generally lower than −30° C., even a small portion of the northern region is lower than −40° C., while a portion of the southern region can even reach above 85° C. due to exposure to sunlight), the tandem element including more OLED light-emitting units is easier to go through the following two manners, resulting in inconsistent brightness attenuation of red, green and blue monochromatic colors, so that the display effect of a white screen changes accordingly, resulting in color deviation.

Manner I. A change in temperature affects a voltage across OLEDs, and thereby the currents of a red light-emitting unit, a blue light-emitting unit and a green light-emitting unit are affected, resulting in different proportions of changes in the brightness of the red light-emitting unit, the blue light-emitting unit and the green light-emitting unit, and resulting in the chromaticity coordinate offset of a white point.

Mode II. A change in temperature affects the luminous efficiency of each of the red light-emitting unit, the blue light-emitting unit and the green light-emitting unit, resulting in different proportions of changes in the brightness of the red light-emitting unit, the blue light-emitting unit and the green light-emitting unit, and resulting in the chromaticity coordinate offset of the white point.

In addition, the spectrum of the light emitted from the light-emitting unit also changes along with the ambient temperature, thereby causing a change in the composition of the synthesized white light, which represents a change in the color system of the white light image quality.

Figure 1:
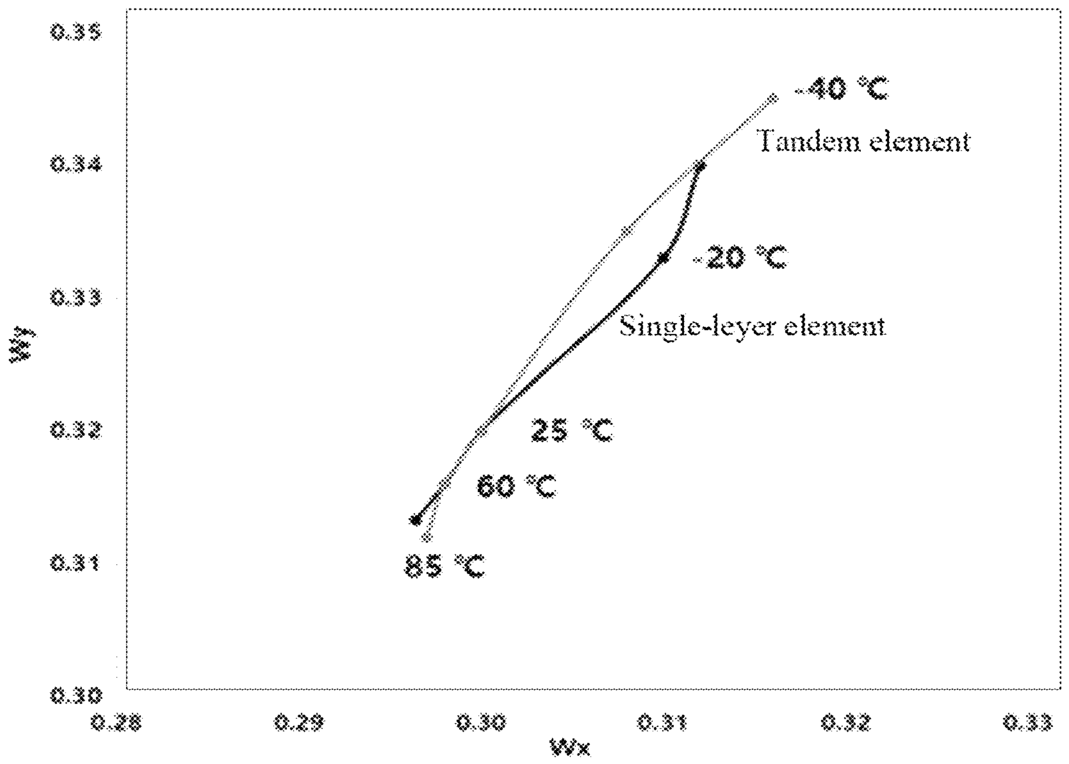
FIG. 1 is a schematic diagram of color shift trajectories of a white color for a tandem element and a single-layer element according to an embodiment of the present disclosure.
Figure 2:
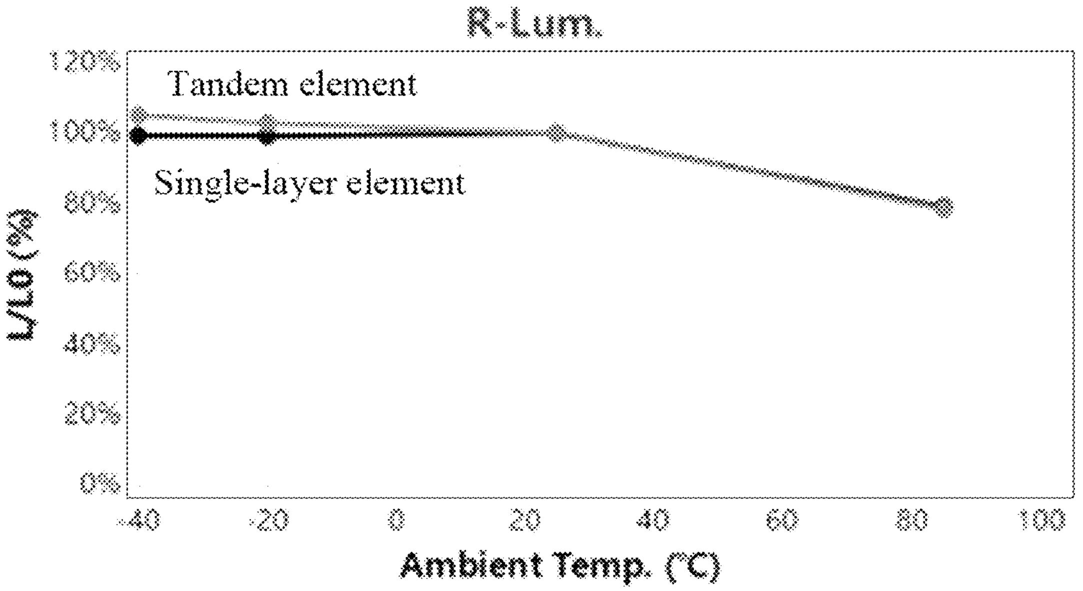
FIG. 2 is a schematic diagram of a change rate of red light brightness along with temperature in a single-layer element and a tandem element according to an embodiment of the present disclosure.
Figure 3:
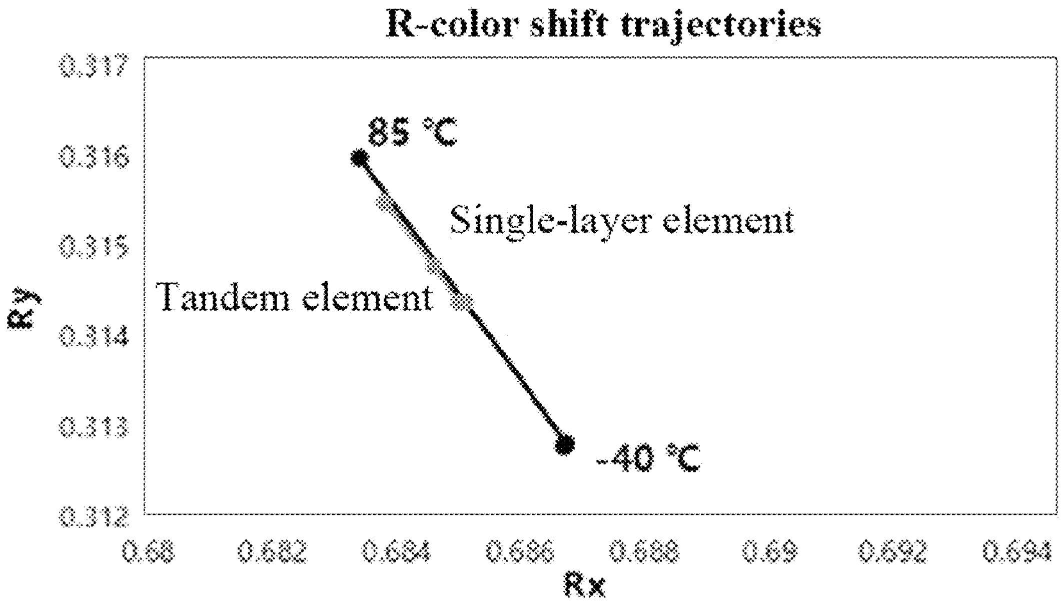
FIG. 3 is a schematic diagram of color shift trajectories of red light in a single-layer element and a tandem element according to an embodiment of the present disclosure.
Figure 4:
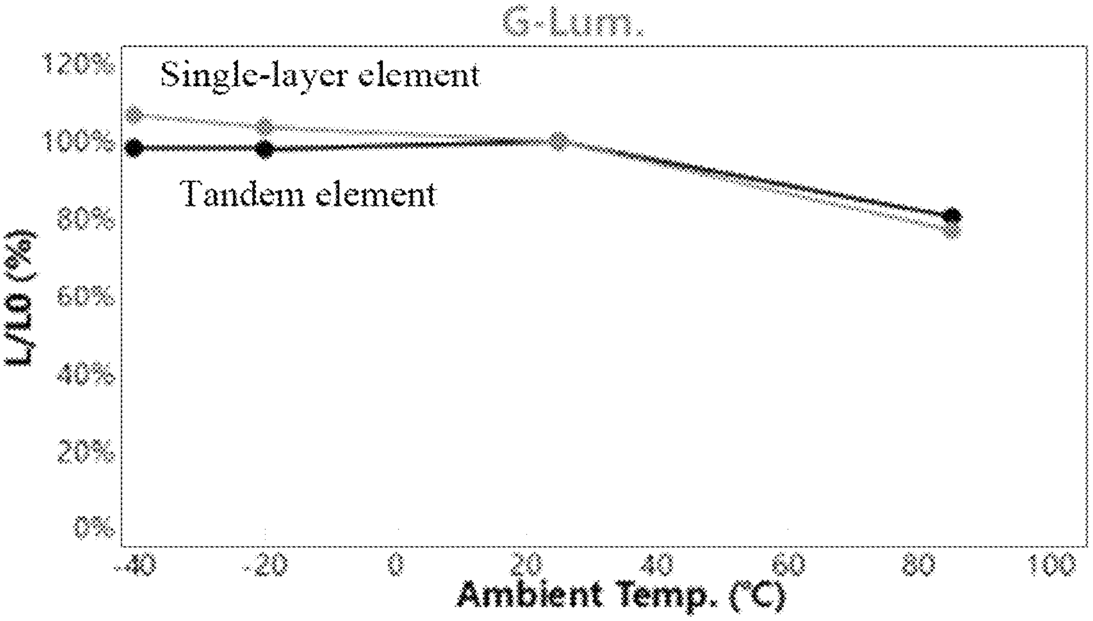
FIG. 4 is a schematic diagram of a change rate of green light brightness along with temperature in a single-layer element and a tandem element according to an embodiment of the present disclosure.
Figure 5:
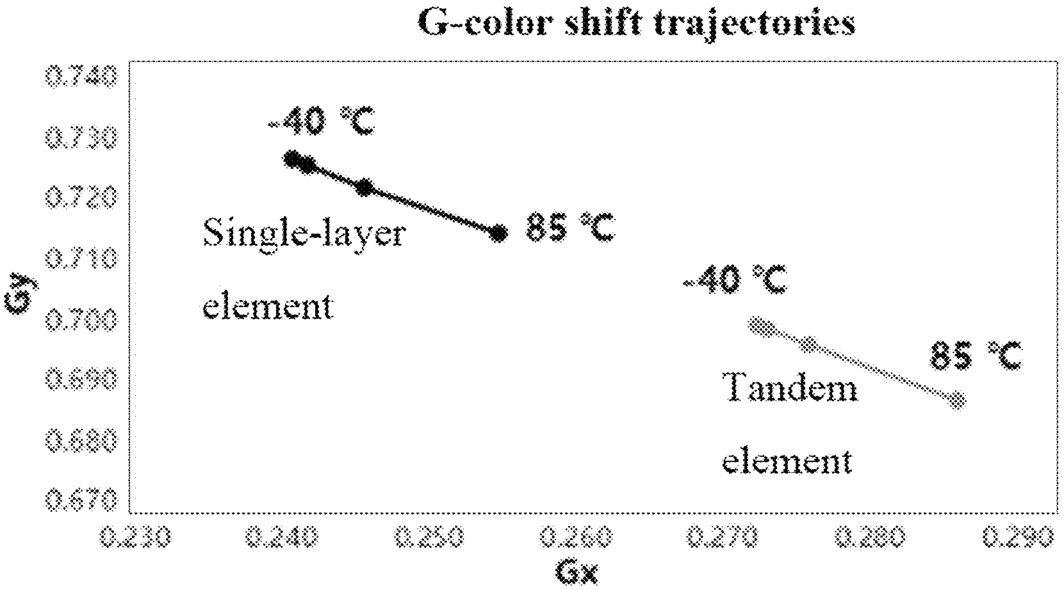
FIG. 5 is a schematic diagram of color shift trajectories of green light in a single-layer element and a tandem element according to an embodiment of the present disclosure.
Figure 6:
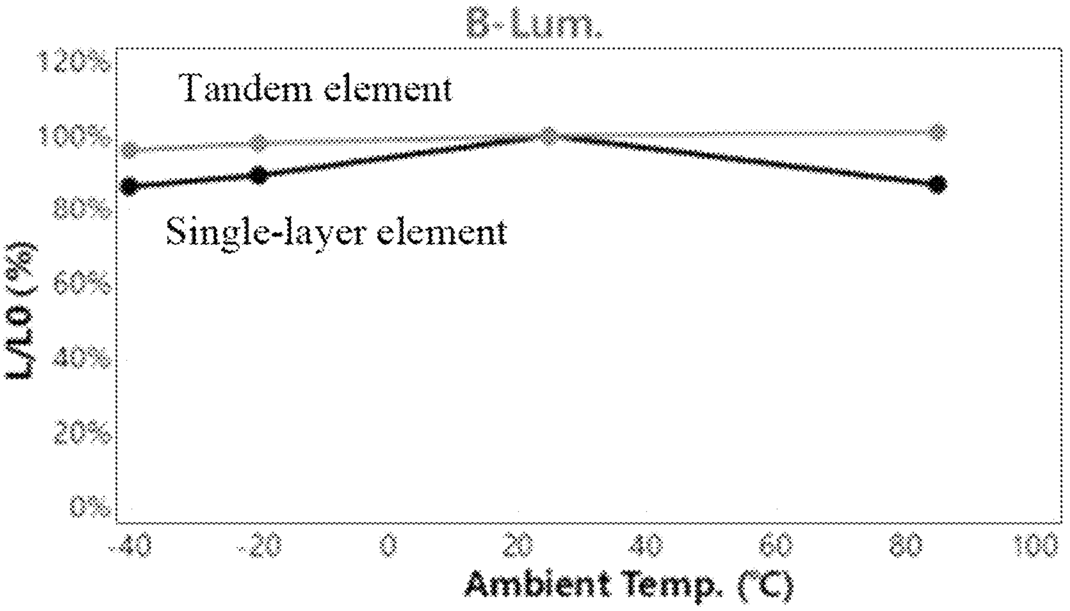
FIG. 6 is a schematic diagram of a change rate of blue light brightness along with temperature in a single-layer element and a tandem element according to an embodiment of the present disclosure.
Figure 7:
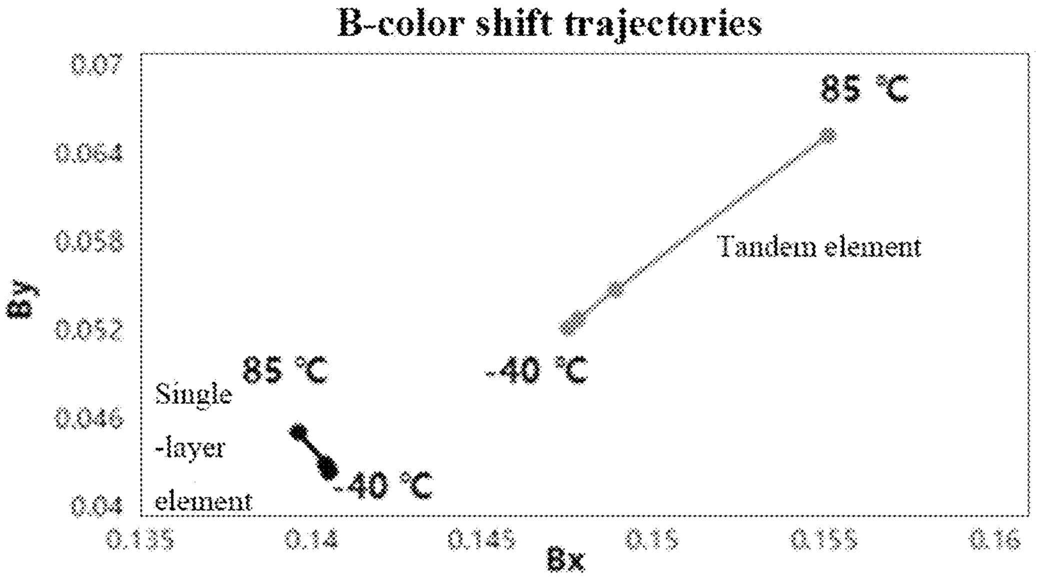
FIG. 7 is a schematic diagram of color shift trajectories of blue light in a single-layer element and a tandem element according to an embodiment of the present disclosure.

FIG. 1 shows color shift trajectories of a white color for a tandem element and a single-layer element. As the applied temperature changes (−40° C. to 85° C.), the color shift trajectory of the tandem element has a basically same trend as the single-layer element, i.e., the color shift trajectory extending towards blue-purple at high temperature and yellow-green at low temperature.

As shown in Table 1, high temperature and low temperature color shift values of the tandem element are significantly increased as compared with the single-layer element, which results in a greater risk of yellowing of the product, resulting in poor visual effect for the user, thus affecting the user experience. Note that in Table 1. JNCD@low temperature represents low temperature color shift value, JNCD@high temperature represents high temperature color shift value, ΔWx/ΔWy represents a change amount of a horizontal coordinate of white point, a change amount of a vertical coordinate of white point, respectively, and Split represents classification. It should be appreciated that the manner in which JNCD is calculated can be found in the relevant art and will not be described in detail herein.

TABLE 1

| Split | ΔWx/ΔWy | JNCD@ low temperature | JNCD@ high temperature |
|---|---|---|---|
| Singe-layer element | 0.012/0.020 | 3.1 | 1.1 |
| Tandem element | 0.016/0.025 | 3.9 | 1.3 |

As shown in FIGS. 2 to 7, the reasons for the high-temperature and low-temperature color shifts of the tandem element are further analyzed, mainly because at −40° C. as compared with the normal temperature 25° C., Gx and By slightly decrease, Rx has no obvious change, and the blue light brightness decreases by about 15%, red light brightness and green light brightness slightly increase, proportions of red light and green light increase, and a proportion of blue light decreases, resulting in an increase in the color shift and an offset in the color shift trajectory towards a yellow-green direction at low temperature. At high temperature, Rx decreases slightly, Gx and By increase, and red light brightness decreases by about 45%, green light brightness decreases by about 55%, blue light brightness decreases by about 35%, a proportion of blue light is more, a proportion of red light is second, resulting in an increase in color shift and an offset in the color shift trajectory towards a blue-violet direction at high temperature.

In view of the above, the present disclosure provides a technical solution, so as to solve the problem that, as the temperature in use decreases or increases, the white light image quality of an OLED element shows a relatively large color shift.

Figure 8:
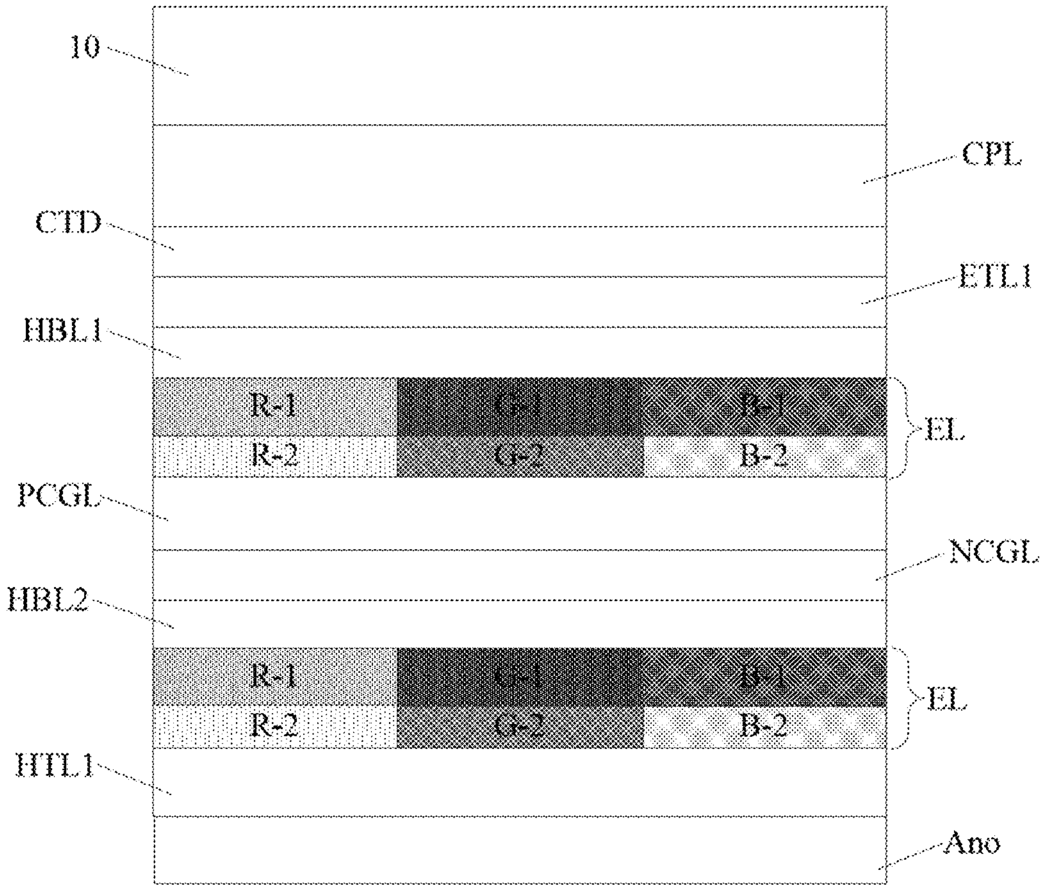
FIG. 8 is a first schematic view showing film layers of a display element according to an embodiment of the present disclosure.

Referring to FIG. 8, an embodiment of the present disclosure provides a display element including: a plurality of light-emitting elements, where at least one light-emitting element includes an anode layer Ano and a cathode layer CTD arranged opposite to each other, and at least two light-emitting units EL which are located between the anode layer Ano and the cathode layer CTD; and an N-type charge generation layer NCGL and a P-type charge generation layer PCGL arranged in a laminated manner are between at least two adjacent light-emitting units EL, wherein the N-type charge generation layer NCGL is close to the anode layer Ano, and the P-type charge generation layer PCGL is close to the cathode layer CTD:

The light-emitting element further includes: a light diffusing layer CPL located on a side of the cathode layer CTD away from the light-emitting units EL, a thickness d1 of the light diffusing layer CPL meeting: 750 Å≤d1≤800 Å.

When an application environment of the display element changes from a normal temperature to a first temperature, a change amount of a horizontal coordinate of a white point of the display element is less than or equal to 0.002, and a change amount of a vertical coordinate of the white point of the display element is less than or equal to 0.008. A color shift value of the display element is less than or equal to 1.4.

Illustratively, the display element may further includes a plurality of driving circuits, each driving circuit is coupled to the anode layer Ano in the corresponding light-emitting element and configured to apply a driving signal to the anode layer Ano in the corresponding light-emitting element, so as to control the light-emitting element to emit light.

Illustratively, the plurality of light-emitting elements is distributed in an array form and the plurality of driving circuits is distributed in an array form.

Illustratively, the cathode layer CTD is made of a metal material, and a thickness of the cathode layer CTD is between 140 Å and 150 Å, with end points inclusive. The material of the cathode layer CTD includes Mg and Ag, and a content ratio of Mg to Ag is between 1:9 and 1:20, with end points inclusive.

Illustratively, the cathode layer CTD further includes an electron assistance film layer, the electron assistance film layer may be made of a Yb material, and a thickness of the electron assistance film layer is between 7 Å and 15 Å, with end points inclusive. The electron assistance film layer may be arranged between a film layer formed of a metal material in the cathode layer CTD and the anode layer Ano, but is not limited thereto.

Illustratively, the at least two light-emitting units include a first light-emitting unit and a second light-emitting unit arranged in a laminated manner, and the first light-emitting unit is arranged between the second light-emitting unit and the anode layer Ano. The first light-emitting unit has a same structure as, or different structure from, the second light-emitting unit.

Illustratively, an N-type charge-generation layer NCGL and a P-type charge generation layer PCGL are provided in a laminated manner between each two adjacent light-emitting units EL, the N-type charge-generation layer NCGL being close to the anode layer Ano and the P-type charge generation layer PCGL being close to the cathode layer CTD. The N-type charge generation layer NCGL may also be referred to as an electron assistance layer. N-type doping is performed on the N-type charge generation layer NCGL and the N-type charge generation layer NCGL is capable of assisting electron transport. The P-type charge generation layer PCGL may also be referred to as a hole assistance layer, and P-type doping is performed on the P-type charge generation layer PCGL and the P-type charge generation layer PCGL is capable of assisting hole transport.

Illustratively, the thickness d1 of the light diffusing layer CPL may take, but not limited to, the value: 750 Å, 760 Å, 770 Å, 780 Å, 790 Å. 800 Å.

Illustratively, the first temperature is between −40° C. and 85° C., with end points inclusive. Note that the normal temperature means 25° C., and the first temperature may be not equal to the normal temperature.

The light diffusing layer CPL is located above the cathode layer CTD and can protect the cathode layer CTD. In addition, the material of the light diffusing layer CPL has such characteristics as high refractive index, low absorption coefficient, which is advantageous for improving the light extraction efficiency of the display element. Further, a length of a microcavity of the display element can be adjusted through changing the thickness of the light diffusing layer CPL, so as to change the light emission spectrum of the display element.

Along with the change of ambient temperature, the composition of the synthesized white light changes, and the color system of white light quality changes. In order to further verify the impact of the film thickness of the light diffusing layer CPL on the high-temperature color shift and the low-temperature color shift in the tandem element, the light diffusing layer CPL with different values of the thickness of 700 Å, 750 Å, 800 Å, 850 Å and 900 Å are formed, so as to achieve verification.

Figure 12:
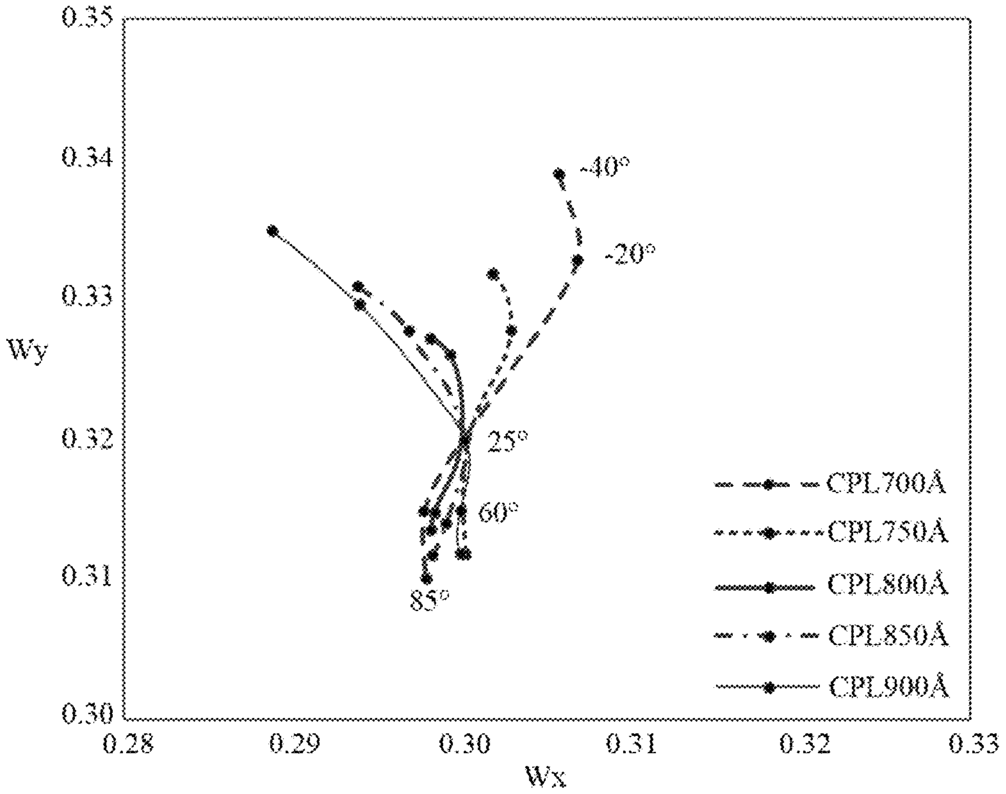
FIG. 12 is a schematic diagram of color shift trajectories of white light corresponding to light diffusing layers with different doping thicknesses according to an embodiment of the present disclosure.

As shown in FIG. 12 and Table 2, the verification results are as follows: as the thickness of the light diffusing layer CPL increases, the values of the high-temperature color shift and the low-temperature color shift show a trend of first decreasing and then increasing. FIG. 12 shows color shift trajectories of light diffusing layers CPL with different thicknesses, following are derived. (1) When the thickness of the light diffusing layer CPL is increased from 700 Å to 800 Å, the color shift trajectories at low temperature (e.g., −40° C.) shows a trend of shifting from yellow-green to cyan and color shift values decrease, the color shift trajectories at high temperature (e.g., 85° C.) do not change significantly. (2) When the thickness of the light diffusing layer CPL is increased from 800 Å to 900 Å, the color shift trajectories at low temperature (e.g., −40° C.) shows a trend of shifting from cyan to green and color shift values increase. When the thickness of the light diffusing layer CPL is 900 Å, the color shift value reaches the maximum. Preferably, when the thickness of the light diffusing layer CPL is 750 Å-800 Å, it is able to significantly mitigate both the low-temperature color shift value and the high-temperature color shift value. In the case where the thickness of the light diffusing layer CPL is 800 Å, the high-temperature color shift value and the low-temperature color shift value each reaches a minimum value, and the color shift trajectory at low temperature is better.

TABLE 2

| Split | CPL THK | ΔWx/ΔWy | JNCD@ low temperature | JNCD@ high temperature |
|---|---|---|---|---|
| Tandem element 1 | 700 Å | 0.006/0.019 | 2.8 | 1.6 |
| Tandem element 2 | 750 Å | 0.002/0.012 | 1.8 | 1.4 |
| Tandem element 3 | 800 Å | 0.002/0.007 | 1.3 | 1.0 |
| Tandem element 4 | 850 Å | 0.006/0.011 | 2.4 | 1.3 |
| Tandem element 5 | 900 Å | 0.001/0.015 | 3.6 | 1.4 |

It is derived from the above-mentioned specific structure of the display element that, in the display element of the embodiments of the present disclosure, the light-emitting element includes at least two light-emitting units EL arranged in a laminated manner, so that the display element can achieve higher light-emitting brightness and current efficiency while improving the service life of the display element.

In the display element of the embodiments of the present disclosure, the N-type charge generation layer NCGL and the P-type charge generation layer PCGL are provided in a laminated manner between at least two adjacent light-emitting units EL, it is able to improve the transport efficiency of carriers (including electrons and holes) between the light-emitting units EL and the recombination efficiency of carriers in the light-emitting units EL.

In the display element of the embodiments of the present disclosure, the thickness d1 of the light diffusing layer CPL is set to meet: 750 Å≤d1≤800 Å, in the case where the application environment of the display element changes from the normal temperature to the first temperature, the change amount of the horizontal coordinate of the white point of the display element is less than or equal to 0.002, and the change amount of the vertical coordinate of the white point of the display element is less than or equal to 0.008. The color shift value of the display element is less than or equal to 1.4.

Through the display element of the embodiments of the present disclosure, it is able to effectively solve the problem that, as the temperature in use decreases or increases, the white light image quality of the display element shows a relatively large color shift, optimize the direction of the color shift trajectory, reduce the color shift value by 70% and avoid the risk of yellowing.

Figure 13:
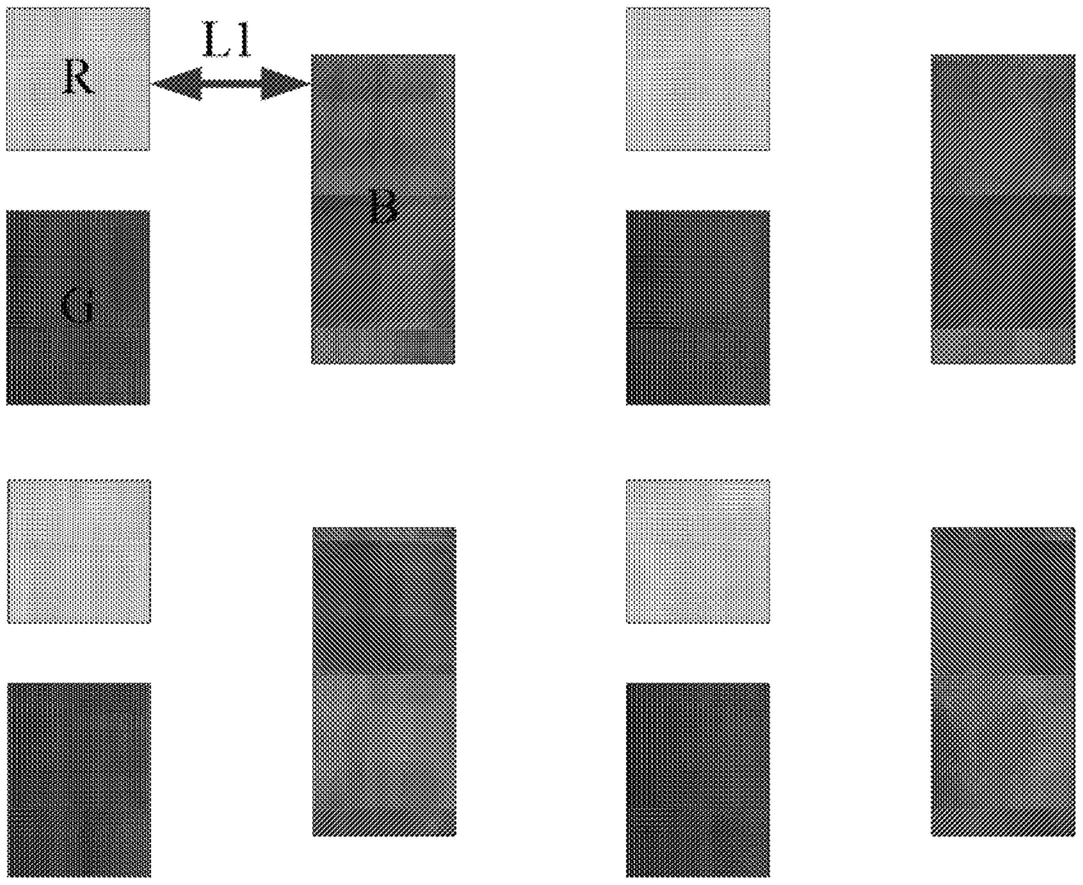
FIG. 13 is a schematic view showing the layout of multiple light-emitting units according to an embodiment of the present disclosure.

As shown in FIG. 13, in some embodiments, the plurality of light-emitting elements is divided into a plurality of light-emitting element groups, each the light-emitting element group includes a first light-emitting element, a second light-emitting element and a third light-emitting element with different colors, the first light-emitting element and the second light-emitting element are located in one column along a first direction, and the third light-emitting element is located in another column.

In a same light-emitting element group, a distance L1 between a pixel opening region of the first light-emitting element and a pixel opening region of the third light-emitting element meets: 18 μm≤L1≤22 μm.

Illustratively, the first light-emitting element includes a red light-emitting element, the second light-emitting element includes a green light-emitting element, and the third light-emitting element includes a blue light-emitting element.

Illustratively, the first light-emitting element, the second light-emitting element and the third light-emitting element are, but not limited to, arranged in a Real RGB manner.

Illustratively, the distance L1 between the pixel opening region of the first light-emitting element and the pixel opening region of the third light-emitting element may take, but not limited to, the value: 18 μm, 19 μm, 20 μm, 21 μm, 22 am.

Through above arrangement, it is not only able to ensure the display effect of the display element, but also to facilitate the display element to achieve high resolution.

In some embodiments, the light-emitting element further includes a pixel driving circuit coupled to the anode layer, a voltage value of a positive power source signal received by the pixel driving circuit is between 4.5V and 4.7V, a voltage value of an initialization signal received by the pixel driving circuit is between −7.6V and −4.8V, and a voltage value of a negative power source signal received by the cathode layer is between −10V and −6V.

In some embodiments, the display element further includes a gate driving circuit coupled to the pixel driving circuit and configured to apply a scanning signal to the pixel driving circuit, a voltage value of a direct current (DC) high-level signal received by the gate driving circuit is between 5V and 9V, and a voltage value of a DC low-level signal received by the gate driving circuit is between −13V and −9V.

By way of example, the voltage value of the positive power source signal received by a pixel driving circuit in the display element may take a value of 4.6V, and the voltage value of the negative power source signal received by the cathode layer CTD in the display element may take a value of −8V, so as to realize a cross voltage of 12.6V. The voltage value of the DC high-level signal VGH received by the gate driving circuit may take a value of 7V, the voltage value of the DC low level signal VGL received by the gate driving circuit may take a value of −11V, the voltage value of the first initialization signal received by the pixel driving circuit is −5V, and the voltage value of the second initialization signal received by the pixel driving circuit is −7.5V.

When the signals received by the pixel driving circuit and the gate driving circuit are set in the above-mentioned range, it is advantageous for the stability of the operation of the display element, and improving the display effect of the display element.

As shown in FIG. 12, in some embodiments, in the case where the first temperature is between 25° C. and 85° C., in the environment of the first temperature, the horizontal coordinate of the white point of the display element is between 0.298-0.3 and the vertical coordinate of the white point of the display element is between 0.308-0.315.

As shown in FIG. 12, in some embodiments, in the case where the first temperature is between −40° C. and 25° C., in the environment of the first temperature, the horizontal coordinate of the white point of the display element is between 0.296-0.3 and the vertical coordinate of the white point of the display element is between 0.327-0.339.

Through the display element of the embodiments of the present disclosure, it is able to effectively solve the problem that, as the temperature in use decreases or increases, the white light image quality of the display element shows a relatively large color shift, optimize the direction of the color shift trajectory, reduce the color shift value and avoid the risk of yellowing.

In some embodiments, the doping concentration m1 of the P-type charge generation layer PCGL meets: 10%≤m1≤15%.

Illustratively, the doping concentration m1 of the P-type charge generation layer PCGL may take, but not limited to, the value: 10%, 11%, 12%, 13%, 14%, 15%.

It has been found that the white light color shift occurring for the display element at high temperature and low temperature is mainly related to that proportions of monochromatic light emitted by monochromatic light-emitting units in different colors (e.g., the red light-emitting unit R, the green light-emitting unit G and the blue light-emitting unit B) changes. Since change rules and influence degrees of the across-voltage at different temperatures are different for the monochromatic light-emitting units in different colors, the driving current of monochromatic light-emitting units in different colors changes at different degrees, and thereby the luminous brightness of the monochromatic light-emitting units in different colors has different change rules, and coordinates of the white point offset.

By adjusting the doping concentration of the p-type charge generation layer PCGL, it has been verified that the concentration of holes in the light-emitting unit EL can be changed, so that the difficulty of exciton recombination changes at the same cross-voltage, thereby alleviating the problem of different proportions of monochromatic light emitted by the monochrome light-emitting units due to different change rules of the across-voltage at different temperatures, and mitigating the color shift.

In more detail, in order to further verify the rule of the impact of the doping concentration of the P-type charge generation layer PCGL on the high-temperature and low-temperature color shifts, the doping concentration of the P-type charge generation layer PCGL at different values of 5%, 10% and 15% are selected to form multiple P-type charge generation layers PCGL through evaporation for verification.

Figure 9:
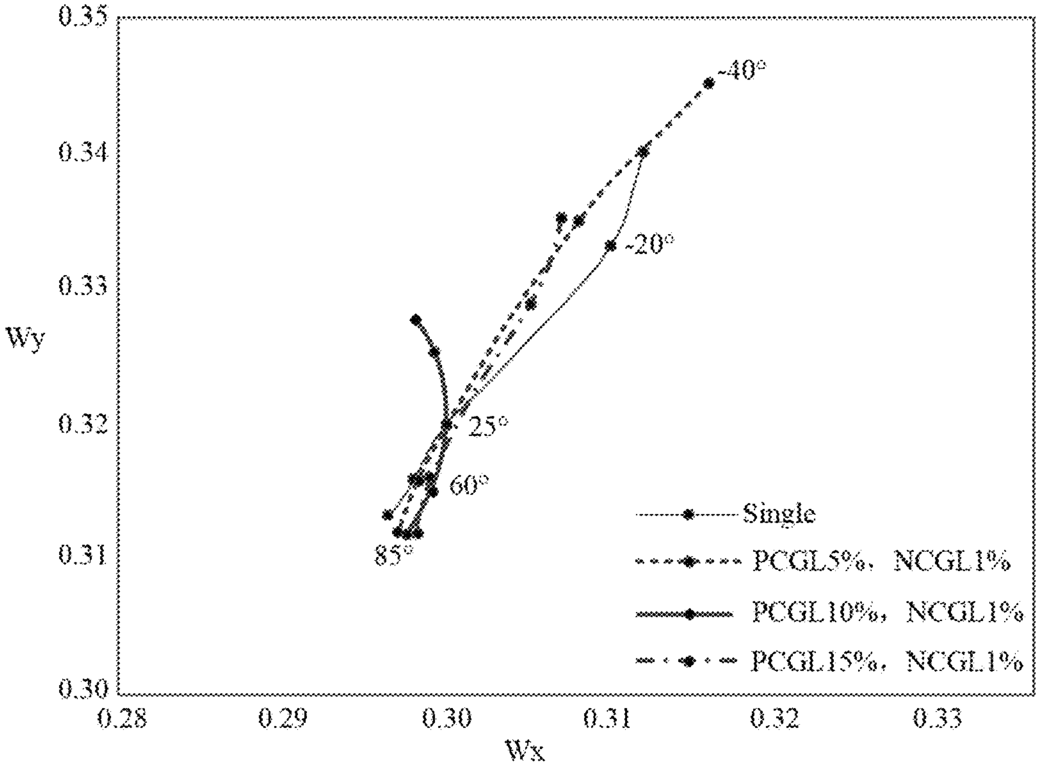
FIG. 9 is a schematic diagram of color shift trajectories of white light corresponding to P-type charge generation layers with different doping concentrations according to an embodiment of the present disclosure.

As shown in FIG. 9 and Table 3, the verification results are as follows: as the doping concentrations of PCGL in the p-type charge generation layer increase, the low-temperature color shift values decrease first and then increase, but the high-temperature color shift values have no obvious change. FIG. 9 shows color shift trajectories corresponding to the P-type charge generation layers PCGL with different doping concentrations. When the doping concentration of the P-type charge generation layer PCGL is changed from 5% to 15%, color shift values and trajectories at high temperature (e.g., 85° C.) do not change significantly as compared with the single-layer element, color shift values at low temperature (e.g., −40° C.) show a trend of first decreasing and then increasing, low-temperature visual effect is yellow first, then cyan, and then yellow-green. When the doping concentration of the P-type charge generation layer PCGL is 5%, the color shift value reaches the maximum. Preferably, when the doping concentration of the P-type charge generation layer PCGL is between 10% and 15%, it is able to significantly mitigate the low-temperature color shift value and trajectory. When the doping concentration of the P-type charge generation layer PCGL is 10%, the low-temperature color shift value reaches a minimum value, e.g., ΔWx/ΔWy≤0.008, JNCD≤1.4, and the trajectory offsets towards cyan, it is able to provide the best user visual effect without affecting user experience.

TABLE 3

| Split | PCGL Dopant | ΔWx/ΔWy | JNCD@ low temperature | JNCD@ high temperature |
|---|---|---|---|---|
| Single-layer element | / | 0.012/0.020 | 3.1 | 1.1 |
| Tandem element 1 | 5% | 0.016/0.025 | 3.9 | 1.3 |
| Tandem element 2 | 10% | 0.002/0.008 | 1.4 | 1.3 |
| Tandem element 3 | 15% | 0.007/0.015 | 2.3 | 1.3 |

In the display element of the above-mentioned embodiment, the doping concentration m1 of the P-type charge generation layer PCGL is set to meet: 10%≤m1≤15%, it is able to effectively solve the problem that, as the temperature in use decreases or increases, the white light image quality of the display element shows a relatively large color shift, optimize the direction of color shift trajectory and avoid the risk of yellowing.

As shown in FIG. 8, in some embodiments, the doping concentration m2 of the N-type charge generation layer NCGL meets: 0.5% 5≤m2<1%.

Illustratively, the doping concentration m2 of the N-type charge generation layer NCGL may take, but not limited to, the value: 0.5%, 0.6%, 0.7%, 0.8%, 0.9%, 1%.

By adjusting the doping concentration of the N-type charge generation layer NCGL, it has been verified that the concentration of electrons in the light-emitting unit EL can be changed, so that the difficulty of exciton recombination changes at the same cross-voltage, thereby alleviating the problem of different proportions of monochromatic light emitted by the monochrome light-emitting units due to different change rules of the across-voltage at different temperatures, and mitigating the color shift.

In more detail, in order to further verify the rule of the impact of the doping concentration of the N-type charge generation layer NCGL on the high-temperature and low-temperature color shifts, on the basis of selecting the doping concentration of the P-type charge generation layer PCGL to be 10%, the doping concentration of the N-type charge generation layer NCGL at different values of 0.5%, 1% and 2% are selected to form multiple the N-type charge generation layers NCGL through evaporation for verification.

Figure 10:
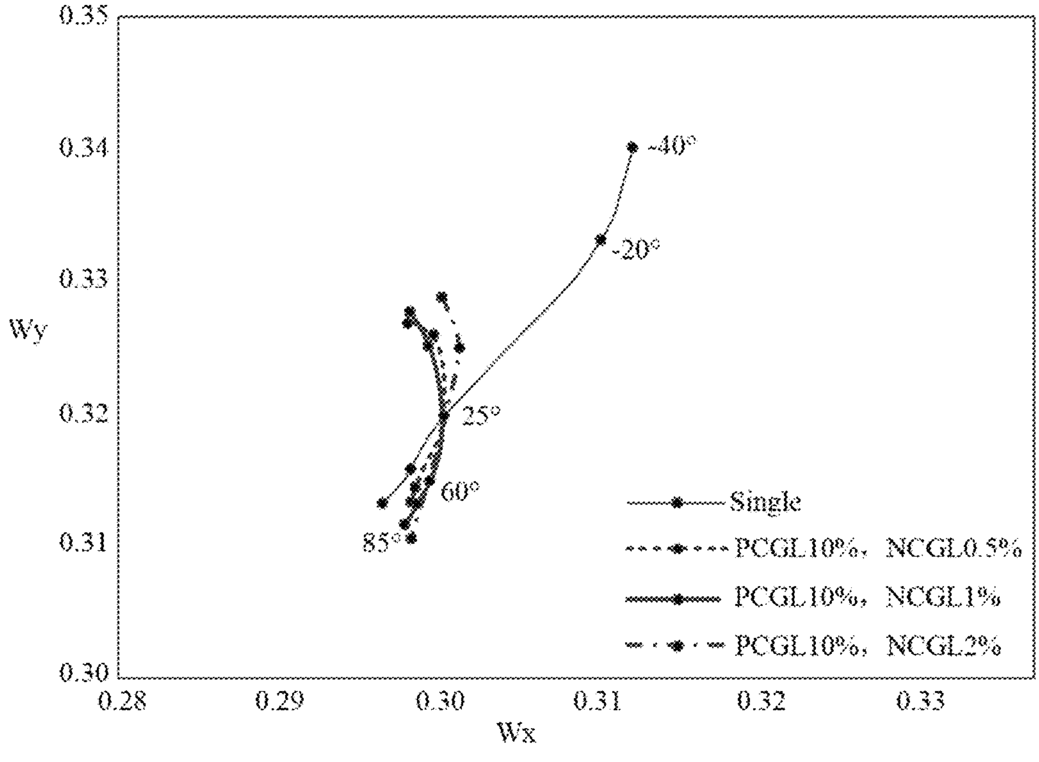
FIG. 10 is a schematic diagram of color shift trajectories of white light corresponding to N-type charge generation layers with different doping concentrations according to an embodiment of the present disclosure.

As shown in FIG. 10 and Table 4, the verification results are as follows: as the doping concentrations of NCGL in the N-type charge generation layer increase, the color shift values at low temperature change slightly, but are significantly mitigated as compared with the single-layer element. The color shift values at high temperature are comparable to those of the single-layer element, and increase slightly along with increasing doping concentration of the N-type charge generation layer NCGL. FIG. 10 shows color shift trajectories corresponding to the N-type charge generation layers NCGL with different doping concentrations. When the doping concentration of the N-type charge generation layer NCGL is changed from 0.5% to 2.0%, color shift trajectories at low temperature (e.g., −40° C.) are more green than the color shift trajectory of the single-layer element, and color shift trajectories at high temperature (e.g., 85° C.) do not change significantly. In addition, as the doping concentration of the N-type charge generation layer NCGL decreases, color shift trajectories at low temperature (e.g., −40° C.) are more cyan. When the doping concentration of N-type charge generation layer NCGL is 2%, the color shift value reaches the maximum. Preferably, when the doping concentration of the N-type charge generation layer NCGL is between 0.5% and 1.0%, it is able to significantly mitigate both the color shift trajectories at low temperature and the color shift values at high temperature. When the doping concentration of the N-type charge generation layer NCGL is 0.5%, the high-temperature color shift value reaches a minimum value, e.g., ΔWx/ΔWy≤0.007, JNCD≤1.3, it is able to provide a better low-temperature color shift and a best user visual effect.

TABLE 4

| Split | NCGL Dopant | ΔWx/ΔWy | JNCD@ low temperature | JNCD@ high temperature |
|---|---|---|---|---|
| Single-layer element | / | 0.012/0.020 | 3.1 | 1.1 |
| Tandem element 1 | 0.5% | 0.002/0.007 | 1.3 | 1.0 |
| Tandem element 2 | 1% | 0.002/0.008 | 1.4 | 1.3 |
| Tandem element 3 | 2% | 0.001/0.009 | 1.5 | 1.4 |

In the display element of the above-mentioned embodiment, the doping concentration m2 of the N-type charge-generation layer NCGL is set to meet: 0.5%≤m2≤1%, it is able to effectively solve the problem that, as the temperature in use decreases or increases, the white light image quality of the display element shows a large color shift, optimize the direction of color shift trajectory and avoid the risk of yellowing.

As shown in FIG. 8, in some embodiments, the light-emitting element further includes a first hole transport layer HTL1 located between the anode layer Ano and the light-emitting unit EL adjacent to the anode layer Ano, and a doping concentration m3 of the first hole transport layer HTL1 meets: 1.0%≤m3≤1.2%.

Illustratively, the doping concentration m3 of the first hole transport layer HTL1 may take, but not limited to, the value: 1.0%, 1.1%, 1.2%.

It has been verified that, through adjusting the doping concentration of the first hole transport layer HTL1, it is also able to alleviate the problem of different proportions of monochromatic light emitted by the monochrome light-emitting units due to different change rules of the across-voltage at different temperatures, so as to mitigate the color shift.

In more detail, in order to further verify the impact of the P-type doping concentration in the first hole transport layer HTL1 on the high-temperature and low-temperature color shift, on the basis of selecting the optimal doping concentration of the P-type charge generation layer PCGL as 10% and the optimal doping concentration of the N-type charge generation layer NCGL as 0.5%, the doping concentration of the first hole transport layer HTL1 at different values of 0.2%, 0.6%, 1.0% and 1.2% are selected to form multiple first hole transport layers HTL1 through evaporation for verification.

Figure 11:
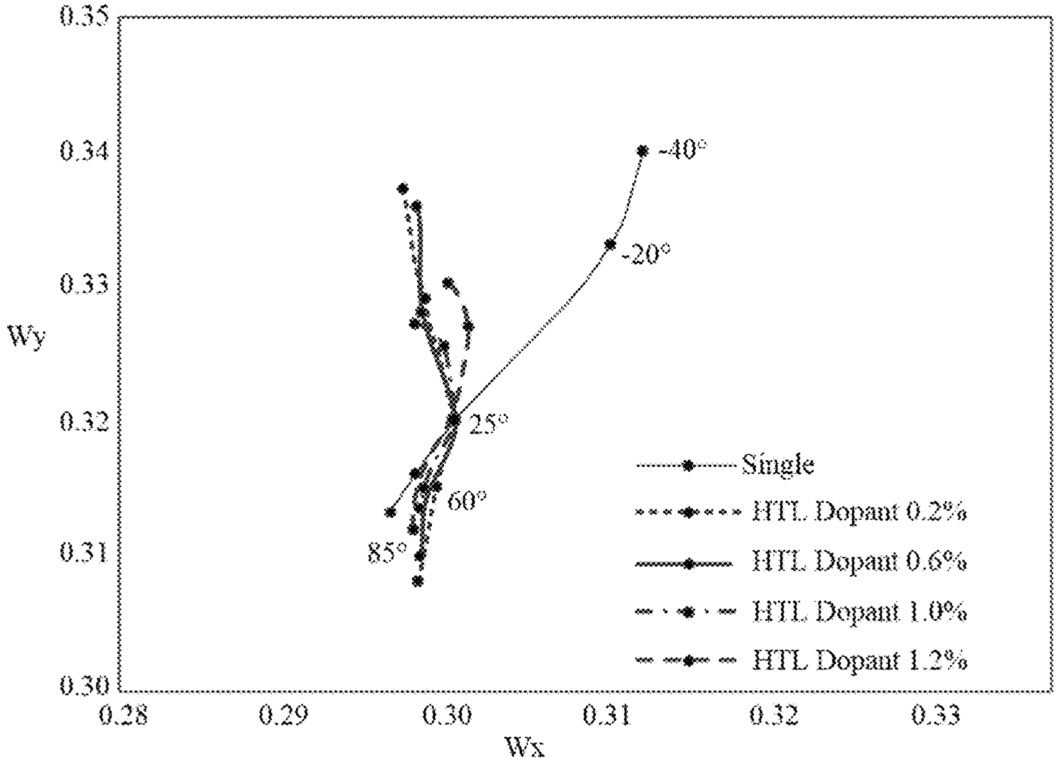
FIG. 11 is a schematic diagram of color shift trajectories of white light corresponding to first hole transport layers with different doping concentrations according to an embodiment of the present disclosure.

As shown in FIG. 11 and Table 5, the verification results are as follows: as the doping concentrations of HTL1 in the first hole transport layer increase, the low-temperature color shift values decrease first and then increase, but are significantly mitigated as compared with the single-layer element. The color shift values at high temperature are comparable to those of the single-layer element and tend to decrease slightly along with increasing doping concentration of the first hole transport layer HTL1. FIG. 11 shows the color shift trajectories corresponding to the first hole transport layers HTL1 with different doping concentrations. When the doping concentration of the first hole transport layer HTL1 is varied from 0.2% to 1.2%, color shift trajectories at low temperature (e.g., −40° C.) are more green than the color shift trajectory of the single-layer element, and color shift trajectories at high temperature (e.g., 85° C.) do not change significantly. In addition, as the doping concentration of the first hole transport layer HTL1 increases from 0.2% to 1.0%, the color shift trajectories at low temperature tend to be cyan, and when the doping concentration of the first hole transport layer HTL1 exceeds 1.0%, the color shift trajectories at low temperature begins to shift toward yellow. When the doping concentration of the first hole transport layer HTL1 is 0.2%, the color shift value reaches the maximum. Preferably, when the doping concentration of the first hole transport layer HTL1 is between 1.0% and 1.2%, it is able to significantly mitigate both the color shift trajectories at low temperature and the color shift values at high temperature. When the doping concentration of the first hole transport layer HTL1 is 1.0%, the high-temperature color shift value and the low-temperature color shift value each reaches a minimum value, e.g., ΔWx/ΔWy≤0.007, JNCD≤1.3, and the color shift trajectories at low temperature are more cyan, so as to provide the best user visual effect.

TABLE 5

| Split | HTL Dopant | ΔWx/ΔWy | JNCD@ low temperature | JNCD@ high temperature |
|---|---|---|---|---|
| Single-layer element | 0.4% | 0.012/0.020 | 3.1 | 1.1 |
| Tandem element 1 | 0.2% | 0.003/0.017 | 3.0 | 1.9 |
| Tandem element 2 | 0.6% | 0.002/0.016 | 2.7 | 1.6 |
| Tandem element 3 | 1.0% | 0.002/0.007 | 1.3 | 1.0 |
| Tandem element 4 | 1.2% | 0.001/0.010 | 1.6 | 1.3 |

In the display element of the above-mentioned embodiment, the doping concentration m3 of the first hole transport layer HTL1 is set to meet: 1.0%≤m3<1.2%, it is able to effectively solve the problem that, as the temperature in use decreases or increases, the white light image quality of the display element shows a large color shift, optimize the direction of color shift trajectory and avoid the risk of yellowing.

In some embodiments, each of the P-type charge generation layer PCGL and the first hole transport layer HTL1 is made of at least one of propylene glycol alginate sodium sulfate, nickel oxide, poly [3-(4-methylamincarboxylbutyl) thiophene]. Illustratively, dopant materials of the P-type charge generation layer PCGL and the first hole transport layer HTL1 are identical.

In some embodiments, the N-type charge generation layer NCGL is made of at least one of carbon 60 or 2,9-dimethyl-4,7-biphenyl-1,10-phenanthroline. A dopant material of the N-type charge generation layer NCGL includes, but not limited to, a rare earth permanent magnetic material Yb.

In some embodiments, the light diffusing layer CPL is made of at least one of triarylamines, cyclic ureas, acyl structures or dibenzothiophenes.

In some embodiments, the P-type charge generation layer PCGL includes a first base transport layer and a first doped layer, a thickness d2 of the first base transport layer meeting: 300 Å≤d2<500 Å, a thickness d3 of the first doped layer meeting: 50 Å≤d3≤200 Å.

Illustratively, the first base transport layer and the first doped layer are arranged in a laminated manner, the first base transport layer is between the first doped layer and the anode layer Ano, or the first base transport layer is between the first doped layer and the cathode layer CTD.

Illustratively, the thickness d2 of the first base transport layer may take, but not limited to, the value: 300 Å, 320 Å, 340 Å, 360 Å, 380 Å, 400 Å, 420 Å, 440 Å. 460 Å, 480 Å, 500 Å.

Illustratively, the thickness d3 of the first doped layer may take, but not limited to, the value: 50 Å, 80 Å. 100 Å, 120 Å, 140 Å, 160 Å, 180 Å, 200 Å.

In some embodiments, the thickness d4 of the N-type charge generation layer NCGL meets: 50 Å≤d4≤250 Å.

Illustratively, the thickness d4 of the N-type charge generation layer NCGL may take the value: 50 Å, 80 Å, 100 Å, 120 Å, 140 Å, 160 Å, 180 Å, 200 Å, 220 Å, 250 Å.

In some embodiments, the first hole transport layer HTL1 includes a second base transport layer and a second doped layer, a thickness d5 of the second base transport layer meeting: 150 Å≤d5≤300 Å, a thickness d6 of the second doped layer meeting: 95 Å≤d6≤105 Å.

Illustratively, the second base transport layer and the second doped layer are arranged in a laminated manner, the second base transport layer being between the second doped layer and the anode layer Ano, or the second base transport layer being between the second doped layer and the cathode layer CTD.

Illustratively, the thickness d5 of the second base transport layer may take, but not limited to, the value: 150 Å, 180 Å, 200 Å, 220 Å, 240 Å, 260 Å, 280 Å, 300 Å.

Illustratively, the thickness d6 of the second doped layer may take, but not limited to, the value: 95 Å, 98 Å. 100 Å, 102 Å, 105 Å.

Figure 14:
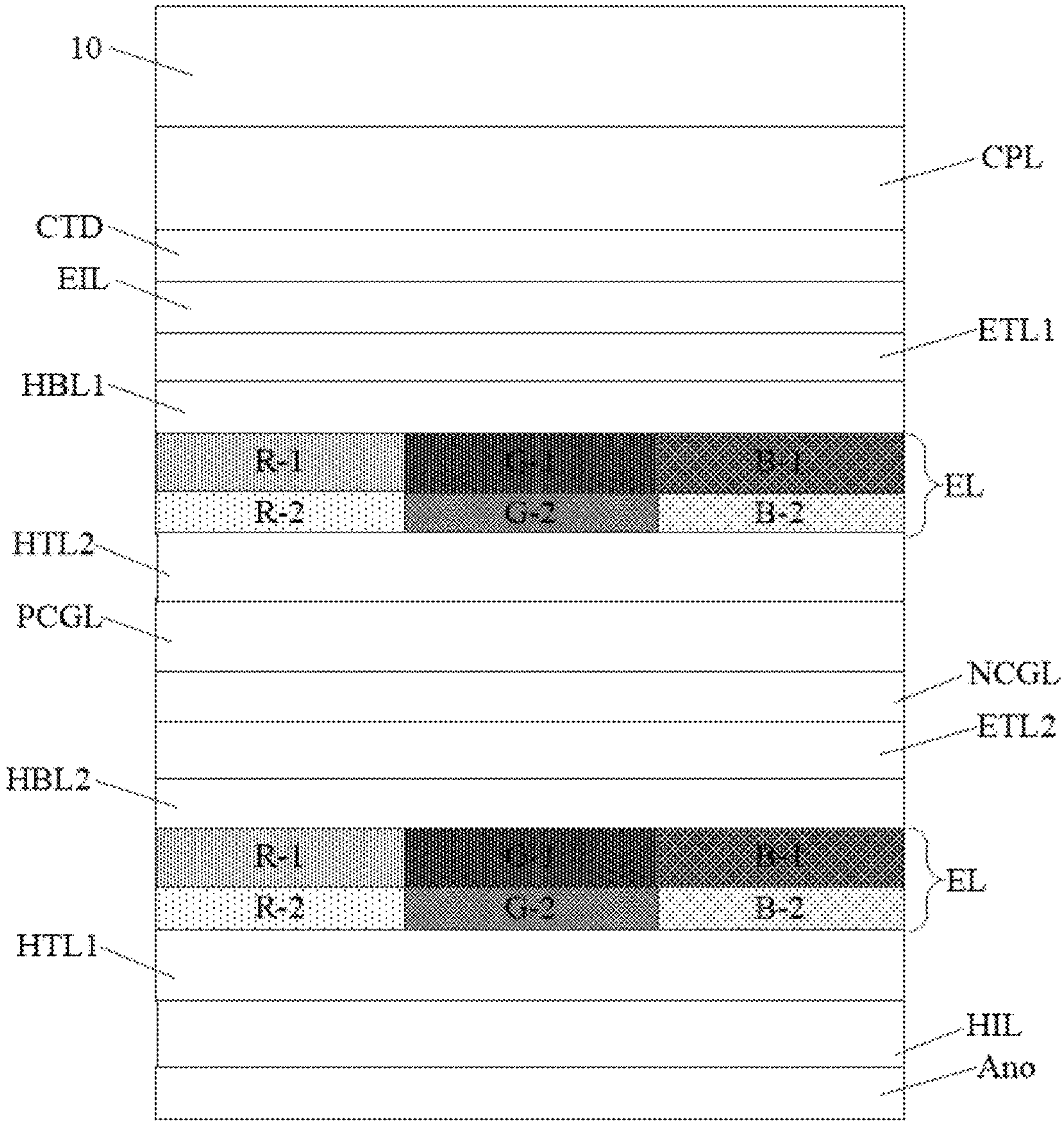
FIG. 14 is a second schematic view showing film layers of a display element according to an embodiment of the present disclosure.

As shown in FIG. 14, in some embodiments, the light-emitting element further includes: a first electron transport layer ETL1 located between the cathode layer CTD and the at least two light-emitting units EL; and/or a second electron transport layer ETL2 located between the N-type charge generation layer NCGL and the light-emitting unit, and the second electron transport layer ETL2 being located at a side of the N-type charge generation layer NCGL away from the P-type charge generation layer PCGL; and/or an electron injection layer EIL located between the cathode layer CTD and the first electron transport layer ETL1; and/or a hole injection layer HIL located between the first hole transport layer HTL1 and the anode layer Ano; and/or a second hole transport layer HTL2 located between the P-type charge generation layer PCGL and the light-emitting unit EL, the second hole transport layer HTL2 being located on a side of the P-type charge generation layer PCGL away from the N-type charge generation layer NCGL.

Illustratively, a thickness of the first electron transport layer ETL1 is between 300 Å and 400 Å, with end points inclusive. The thickness of the first electron transport layer ETL1 may take, but not limited to, the value: 300 Å, 320 Å, 340 Å, 360 Å, 380 Å, 400 Å.

Illustratively, the dopant material of the first electron transport layer ETL1 may be, but not limited to, Liq, a doping ratio may be, but not limited to, 50%.

The light-emitting element further includes the first electron transport layer ETL1, the second electron transport layer ETL2 and the electron injection layer EIL, so it is advantageous for improving the electron transport efficiency. The light-emitting element further includes the hole injection layer HIL, the first hole transport layer HTL1 and the second hole transport layer HTL2, so it is advantageous for improving the hole transport efficiency, thereby improving the carrier transport efficiency of the display element.

In some embodiments, the light-emitting element further includes: a first hole-blocking layer HBL1 located between the electron transport layer ETL and the at least two light-emitting units EL; and/or at least one second hole blocking layer HBL2 located on a side of the corresponding N-type charge generation layer NCGL facing the anode layer Ano, and the second hole blocking layer HBL2 being located between the corresponding N-type charge generation layer NCGL and the light-emitting unit EL adjacent to the N-type charge generation layer NCGL.

Illustratively, the light-emitting element includes n light-emitting units EL, n being an integer greater than or equal to 2. The light-emitting element includes n-I second hole blocking layers HBL2, and one second hole blocking layer HBL2 is arranged between each two adjacent light-emitting elements.

Illustratively, the hole blocking layer has a thickness between 50 Å and 70 Å, with end points inclusive. The thickness of the hole blocking layer may take, but not limited to, the value: 55 Å, 60 Å, 65 Å, 70 Å.

The light-emitting element includes the first hole blocking layer HBL1 and the second hole blocking layer HBL2, so it facilitates the recombination efficiency of electrons and holes.

In some embodiments, the light-emitting unit EL includes a buffer layer and a light-emitting material layer arranged in a laminated manner, the buffer layer being located between the light-emitting material layer and the anode layer Ano.

In the display element, the light-emitting unit includes the buffer layer and the light-emitting material layer, the buffer layer is capable of improving a transport efficiency of carriers, thereby improving a light-emitting efficiency of the display element.

As shown in FIGS. 13 and 14, in some embodiments, the first light-emitting element includes a red light-emitting unit R, the second light-emitting element includes a green light-emitting unit G, and the third light-emitting element includes a blue light-emitting unit B.

The red light-emitting unit R includes a red buffer layer R-2 and a red light-emitting material layer R-1, a thickness d7 of the red buffer layer R-2 meets: 100 Å≤d7≤350 Å, a thickness d8 of the red light-emitting material layer R-1 meets: 400 Å≤d8≤500 Å, and a doping concentration m4 of the red light-emitting material layer R-1 meets: 10%≤m4≤15%.

The green light-emitting unit G includes a green buffer layer G-2 and a green light-emitting material layer G-1, a thickness d9 of the green buffer layer G-2 meets: 80 Å≤d9≤100 Å, a thickness d10 of the green light-emitting material layer G-1 meets: 300 Å≤d10≤500 Å, and a doping concentration m5 of the green light-emitting material layer G-1 meets: 8%≤m5≤10%;

The blue light-emitting unit B includes a blue buffer layer B-2 and a blue light-emitting material layer B-1, a thickness d11 of the blue buffer layer B-2 meets: 80 Å≤d11≤100 Å, a thickness d12 of the blue light-emitting material layer B-1 meets: 150 Å≤d12≤200 Å, and a doping concentration m6 of the blue light-emitting material layer B-1 meets: 2%≤m6≤3%.

Illustratively, the thickness d7 of the red buffer layer R-2 may take, but not limited to, the value: 100 Å, 120 Å, 140 Å. 160 Å, 180 Å, 200 Å, 220 Å, 240 Å, 260 Å, 280 Å, 300 Å, 320 Å, 350 Å.

Illustratively, the thickness d8 of the red light-emitting material layer R-1 may take, but not limited to, the value: 400 Å, 420 Å, 440 Å, 460 Å. 480 Å, 500 Å.

Illustratively, the doping concentration m4 of the red light-emitting material layer R-1 may take, but not limited to, the value: 10%, 11%, 12%, 13%, 14%, 15%.

Illustratively, the thickness d9 of the green buffer layer G-2 may take, but not limited to, the value: 80 Å, 85 Å, 90 Å. 95 Å, 100 Å.

Illustratively, the thickness d10 of the green light-emitting material layer G-1 may take, but not limited to, the value: 300 Å, 320 Å, 340 Å. 360 Å. 380 Å. 400 Å, 420 Å, 440 Å, 460 Å, 480 Å, 500 Å.

Illustratively, the doping concentration m5 of the green light-emitting material layer G-I may take, but not limited to, the value: 8%, 8.5%, 9%, 10%.

Illustratively, the thickness d11 of the blue buffer layer B-2 may take, but not limited to, the value: 80 Å, 85 Å, 90 Å, 95 Å, 100 Å.

Illustratively, the thickness d12 of the blue light-emitting material layer B-1 may take, but not limited to, the value: 150 Å, 160 Å, 170 Å, 180 Å, 190 Å, 200 Å.

Illustratively, the doping concentration m6 of the blue light-emitting material layer B-1 may take, but not limited to, the value: 2%, 2.2%, 2.4%, 2.6%, 2.8%, 3%.

As shown in FIG. 8, in some embodiments the display element further includes a protective layer 10 at a side of the cathode layer CTD away from the anode layer Ano.

Illustratively, the protective layer 10 is made of, but not limited to, a lithium fluoride LiF material.

Embodiments of the present disclosure further provide a display device including the display element according to the above embodiments.

Note that the display device may be: any product or member having a display function, e.g., a television, a display, a digital photo frame, a mobile phone, an on-vehicle tandem device and a tablet computer, and the display device further includes a flexible circuit board, a printed circuit board and a backplane, etc.

In the display element, the light-emitting element includes at least two light-emitting units arranged in a laminated manner, so that the display element can achieve higher light emission brightness and current efficiency while improving the service life of the display element. The N-type charge-generation layer and the P-type charge generation layer are provided in a laminated manner between at least two adjacent light-emitting units, so the transport efficiency of carriers (including electrons and holes) between the light-emitting units and the recombination efficiency of carriers in the light-emitting units are enhanced. Through the display element, it is able to effectively solve the problem that, as the use temperature of the display element decreases or increases, the white light image quality shows a relatively large color shift.

The display device in the embodiments of the present disclosure also has the above-mentioned advantageous effects when including the above-mentioned display element, and will not be described in detail herein.

In the embodiments of the present disclosure, the order of the steps is not limited to the serial numbers thereof. For a person skilled in the art, any change in the order of the steps shall also fall within the scope of the present disclosure if without any creative effort.

It should be appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

It should be appreciated that, the expression "at a same layer" refers to that the film layers are arranged on a same structural layer. Alternatively, for example, the film layers on a same layer may be layer structures formed through forming thin layers for forming specific patterns through a single film-forming process and then patterning the film layers with a same mask through a single patterning process. Depending on different specific patterns, a single patterning process may include multiple exposure, development or etching processes, and the specific patterns in the layer structures may be continuous or discontinuous. These specific patterns may also be arranged at different levels or have different thicknesses.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The aforementioned are merely specific embodiments of the present disclosure, but a scope of the present disclosure is not limited thereto. Any modifications or replacements that would easily occurred to a person skilled in the art, without departing from the technical scope disclosed in the disclosure, should be encompassed in the scope of the present disclosure. Therefore, the scope of the present disclosure shall be subject to the scope defined by the appended claims.

What is claimed is:

1. A display element comprising: a plurality of light-emitting elements, wherein at least one light-emitting element comprises an anode layer and a cathode layer arranged opposite to each other, and at least two light-emitting units located between the anode layer and the cathode layer;

an N-type charge generation layer and a P-type charge generation layer arranged in a laminated manner between the at least two light-emitting units, wherein the N-type charge generation layer is close to the anode layer and the P-type charge generation layer is close to the cathode layer;

the at least one light-emitting element further comprising:

a light diffusing layer located on a side of the cathode layer away from the at least two light-emitting units, a thickness d1 of the light diffusing layer meeting: 750 Å≤d1≤800 Å; wherein when an application environment of the display element changes from a normal temperature to a first temperature, a change amount of a horizontal coordinate of a white point of the display element is less than or equal to 0.002, and a change amount of a vertical coordinate of the white point of the display element is less than or equal to 0.008; and a color shift value of the display element is less than or equal to 1.4.

2. The display element according to claim 1, wherein the plurality of light-emitting elements is divided into a plurality of light-emitting element groups, each light-emitting element group comprises a first light-emitting element, a second light-emitting element and a third light-emitting element with different colors, wherein the first light-emitting element and the second light-emitting element are located in one column along a first direction, and the third light-emitting element is located in another column;

in a same light-emitting element group, a distance L1 between a pixel opening region of the first light-emitting element and a pixel opening region of the third light-emitting element meets: 18 μm≤L1≤22 μm.

3. The display element according to claim 1, wherein the at least one light-emitting element further comprises a pixel driving circuit coupled to the anode layer, a voltage value of a positive power source signal received by the pixel driving circuit is between 4.5V and 4.7V, a voltage value of an initialization signal received by the pixel driving circuit is between −7.6V and −4.8V, and a voltage value of a negative power source signal received by the cathode layer is between −10V and −6V.

4. The display element according to claim 3, wherein the display element further comprises a gate driving circuit coupled to the pixel driving circuit and configured to apply a scanning signal to the pixel driving circuit, a voltage value of a direct current (DC) high-level signal received by the gate driving circuit is between 5V and 9V, and a voltage value of a DC low-level signal received by the gate driving circuit is between −13V and −9V.

5. The display element according to claim 1, wherein when the first temperature is between 25° C. and 85° C., in an environment of the first temperature, the horizontal coordinate of the white point of the display element is between 0.298 and 0.3, and the vertical coordinate of the white point of the display element is between 0.308 and 0.315.

6. The display element according to claim 1, wherein when the first temperature is between −40° C. and 25° C., in an environment of the first temperature, wherein the horizontal coordinate of the white point of the display element is between 0.296 and 0.3, and the vertical coordinate of the white point of the display element is between 0.327 and 0.339.

7. The display element according to claim 1, wherein a doping concentration m1 of the P-type charge generation layer meets: 10%≤m1≤15%.

8. The display element according to claim 1, wherein a doping concentration m2 of the N-type charge generation layer meets: 0.5%≤m2≤1%.

9. The display element according to claim 1, wherein the at least one light-emitting element further comprises:

a first hole transport layer located between the anode layer and the at least two light-emitting units adjacent to the anode layer, and a doping concentration m3 of the first hole transport layer meeting: 1.0%≤m3≤1.2%.

10. The display element according to claim 9, wherein each of the P-type charge generation layer and the first hole transport layer is made of at least one of propylene glycol alginate sodium sulfate, nickel oxide, or poly [3-(4-methyl-amincarboxylbutyl) thiophene].

11. The display element according to claim 9, wherein the first hole transport layer comprises a second base transport layer and a second doped layer, a thickness d5 of the second base transport layer meeting: 150 Å≤d5≤300 Å, and a thickness d6 of the second doped layer meeting: 95 Å≤d6≤105 Å.

12. The display element according to claim 1, wherein the N-type charge generation layer is made of at least one of carbon 60 or 2,9-dimethyl-4,7-biphenyl-1,10-phenanthroline.

13. The display element according to claim 1, wherein the light diffusing layer is made of at least one of triarylamines, cyclic ureas, acyl structures or dibenzothiophenes.

14. The display element according to claim 1, wherein the P-type charge generation layer comprises a first base transport layer and a first doped layer, a thickness d2 of the first base transport layer meeting: 300 Å≤d2≤500 Å, a thickness d3 of the first doped layer meeting: 50 Å≤d3≤200 Å.

15. The display element according to claim 1, wherein a thickness d4 of the N-type charge generation layer meets: 50 Å≤d4≤250 Å.

16. The display element according to claim 9, wherein the at least one light-emitting element further comprises:

a first electron transport layer located between the cathode layer and the at least two light-emitting units; and/or a second electron transport layer located between the N-type charge generation layer and the at least two light-emitting units, and the second electron transport layer located on a side of the N-type charge generation layer away from the P-type charge generation layer; and/or an electron injection layer located between the cathode layer and the first electron transport layer; and/or a hole injection layer located between the first hole transport layer and the anode layer; and/or a second hole transport layer located between the P-type charge generation layer and a light-emitting unit of the at least two light-emitting units, and the second hole transport layer located on a side of the P-type charge generation layer away from the N-type charge generation layer.

17. The display element according to claim 9, wherein the at least one light-emitting element further comprises:

a first hole blocking layer located between the electron transport layer and the at least two light-emitting units; and/or at least one second hole blocking layer located on a side of a corresponding N-type charge generation layer facing the anode layer, and the second hole blocking layer located between a corresponding N-type charge generation layer and the at least two light-emitting units adjacent to the N-type charge generation layer.

18. The display element according to claim 2, wherein the at least two light-emitting units comprises a buffer layer and a light-emitting material layer arranged in a laminated manner, the buffer layer is located between the light-emitting material layer and the anode layer.

19. The display element according to claim 18, wherein the first light-emitting element comprises a red light-emitting unit, the second light-emitting element comprises a green light-emitting unit, and the third light-emitting element comprises a blue light-emitting unit;

the red light-emitting unit comprises a red buffer layer and a red light-emitting material layer, a thickness d7 of the red buffer layer meets: 100 Å≤d7≤350 Å, a thickness d8 of the red light-emitting material layer meets: 400 Å≤d8≤500 Å, and a doping concentration m4 of the red light-emitting material layer meets: 10%≤m4≤15%;

the green light-emitting unit comprises a green buffer layer and a green light-emitting material layer, a thickness d9 of the green buffer layer meets: 80 Å≤d9≤100 Å, a thickness d10 of the green light-emitting material layer meets: 300 Å≤d10≤500 Å, and a doping concentration m5 of the green light-emitting material layer meets: 8%≤m5≤10%; and the blue light-emitting unit comprises a blue buffer layer and a blue light-emitting material layer, a thickness d11 of the blue buffer layer meets: 80 Å≤d11≤100 Å, a thickness d12 of the blue light-emitting material layer meets: 150 Å≤d12≤200 Å, and a doping concentration m6 of the blue light-emitting material layer meets: 2%≤m6≤3%.

20. A display device comprising the display element according to claim 1.

* * * * *